United States Patent [19]
Hasegawa

[11] Patent Number: 5,623,208
[45] Date of Patent: Apr. 22, 1997

[54] Z-AXIS MAGNETIC FIELD GRADIENT COIL STRUCTURE FOR MAGNETIC RESONANCE SYSTEM

[75] Inventor: Kenichi Hasegawa, Tokyo, Japan

[73] Assignee: JEOL Ltd., Tokyo, Japan

[21] Appl. No.: 228,681

[22] Filed: Apr. 14, 1994

[30] Foreign Application Priority Data

Apr. 14, 1993 [JP] Japan .................................. 5-087350

[51] Int. Cl.⁶ .................................................. G01R 33/20
[52] U.S. Cl. .................................................... 324/318
[58] Field of Search .................................. 324/300, 318, 324/322; 128/653.5; 335/296, 299

[56] References Cited

U.S. PATENT DOCUMENTS

| | | | |
|---|---|---|---|
| 4,910,462 | 3/1990 | Roemer et al. | 324/318 |
| 4,959,613 | 9/1990 | Yamamoto et al. | 324/318 |
| 5,111,147 | 5/1992 | Aubert | 324/318 |
| 5,177,441 | 1/1993 | Morich et al. | 324/318 |
| 5,198,769 | 3/1993 | Frese et al. | 324/318 |
| 5,235,283 | 8/1993 | Lehne et al. | 324/318 |
| 5,278,504 | 1/1994 | Patrick et al. | 324/322 |
| 5,289,129 | 2/1994 | Joseph | 324/322 |
| 5,294,126 | 3/1994 | Schaefer | 324/318 |
| 5,334,937 | 8/1994 | Peck et al. | 324/318 |
| 5,349,318 | 9/1994 | Inoue | 324/318 |
| 5,349,744 | 9/1994 | Takahashi | 324/318 |
| 5,406,205 | 4/1995 | Muller | 324/318 |

FOREIGN PATENT DOCUMENTS

| | | | |
|---|---|---|---|
| 0586983 | 3/1994 | European Pat. Off. . | |
| 9401785 | 1/1994 | WIPO | 324/318 |
| 9411749 | 5/1994 | WIPO | 324/318 |
| 9420862 | 9/1994 | WIPO | 324/318 |

Primary Examiner—Sandra L. O'Shea
Assistant Examiner—Raymond Y. Mah
Attorney, Agent, or Firm—Webb Ziesenheim Bruening Logsdon Orkin & Hanson, P.C.

[57] ABSTRACT

A Z-axis magnetic field gradient coil structure for producing a desired magnetic field gradient without increasing the electrical resistance of conductors forming a coil pattern. The coil structure comprises a flexible insulative substrate to be wound on a cylindrical bobbin. The substrate is several times as long as the circumference of the bobbin. The coil pattern is formed on the substrate by etching techniques and comprises pairs of conductive strips and conductive interconnectors for interconnecting these strips. The pairs of conductive strips are symmetrical with respect to the central line of the pattern.

8 Claims, 5 Drawing Sheets

Z-AXIS MAGNETIC FIELD GRADIENT COIL STRUCTURE FOR MAGNETIC RESONANCE SYSTEM

FIELD OF THE INVENTION

The present invention relates to a Z-axis magnetic field gradient-producing coil structure for use in an MR (magnetic resonance) system.

BACKGROUND OF THE INVENTION

In an MR system, it is necessary that a magnetic field gradient be produced along each of the three mutually orthogonal axes (X-, Y-, and Z-axes) of a Cartesian coordinate system. Coils for producing a Z-axis magnetic field gradient in a system where a static magnetic field is generated in the Z-axis direction have been heretofore fabricated by winding wires on a bobbin.

In this prior art technique, annular grooves are formed in given positions on a bobbin, and wires are wound a given number of times in the grooves in order to produce a desired magnetic field gradient. This method needs skillfulness to fabricate the coils. Also, it is difficult to machine this coil assembly.

A method of fabricating Z-axis gradient coils by forming a desired coil pattern on a flexible insulative substrate, winding the substrate around a bobbin, and bonding the substrate to the bobbin has been proposed as disclosed in U.S. Pat. No. 4,910,462 entitled "Etched Z-Axis Gradient Coils For NMR System". These coils need neither the prior art bobbin-machining step nor the prior art wire-winding step. Also, it is easy to fabricate these Z-axis gradient coils, because it is only necessary that the flexible insulative substrate be wound on and bonded to the bobbin.

Where a strong magnetic field gradient is produced using the Z-axis gradient coils disclosed in the above-cited U.S. Pat. No. 4,910,462, it is necessary to increase the number of conductive strips existing in unit length of coil by reducing the width of each conductive strip contained in the coil pattern. Where the conductive strips are narrowed in this way, the electrical resistance of each conductive strip and hence the electrical resistance of the whole coil is increased. Generally, to cause an electrical current to flow through a coil of large electrical resistance, a power supply of a large capacity is necessary. Furthermore, heat generated by the coil presents problems. Therefore, coils having smaller electrical resistance are preferred.

SUMMARY OF THE INVENTION

It is an object of the present invention to provide a Z-axis magnetic field gradient coil structure in which conductors forming a coil pattern have a small electrical resistance but which can produce a strong magnetic field gradient.

The above object is achieved in accordance with the teachings of the invention by a Z-axis magnetic field gradient coil structure for producing a Z-axis magnetic field gradient responsive to flow of an electrical current I, said coil structure comprising: a flexible insulative substrate wound substantially into the form of a cylinder so that two opposite ends of said substrate form a bottom layer and a top layer, respectively; a coil pattern formed on said substrate and comprising a plurality of pairs of elongated conductive strips and interconnecting means for causing said current I to flow into a first one of said strips so that the current then flows through each strip successively and flows out of a final one of said strips.

The length of the flexible insulative substrate is so set that it is wound on the bobbin plural times. A desired coil pattern is formed on the substrate to produce a desired magnetic field gradient when the substrate has been wound plural times into the form of a cylinder. When an electrical current is supplied; a desired magnetic field gradient is developed.

This coil pattern includes the plurality of pairs of elongated conductive strips and the interconnecting means for causing the current I to flow into a first one of said strips so that the current then flows through each strip successively and flows out of a final one of said strips. When the substrate has been wound several times into a cylinder, a coil structure is formed. This coil structure includes at least one pair of conductive strips which are substantially parallel to the central cross-sectional plane perpendicular to the central axis of the cylinder and arranged symmetrically with respect to the central cross-sectional plane. The length of these strips is so set that they make one turn around the cylinder.

In this way, in the novel Z-axis magnetic field gradient coil structure, the flexible insulative substrate is wound plural times so that the conductive strips can overlap each other radially. Hence, the number of conductive strips contained in a unit length of coil can be increased without decreasing the width of the conductive strips. As a result, the Z-axis magnetic field gradient coil structure can produce a strong magnetic field gradient although its electrical resistance is small.

Interconnectors interconnect the conductive strips successively in such a way that electrical currents of opposite senses flow through the two conductive strips of each pair. The substrate is wound in plural layers on the bobbin such that one end forms a bottom layer. Each conductive strip forms one turn of coil around the Z-axis. Some sets of pairs of conductive strips are so arranged that the distance from the X-Y plane increases successively and form a distributed winding with a small pitch. The other sets form closely wound multilayer coils which are equally spaced from the X-Y plane. An electrical current is caused to flow through each conductive strip to produce a Z-axis magnetic field gradient inside the coil structure.

Other objects and features of the invention will appear in the course of the description thereof, which follows.

DETAILED DESCRIPTION OF THE INVENTION

Figure 1:
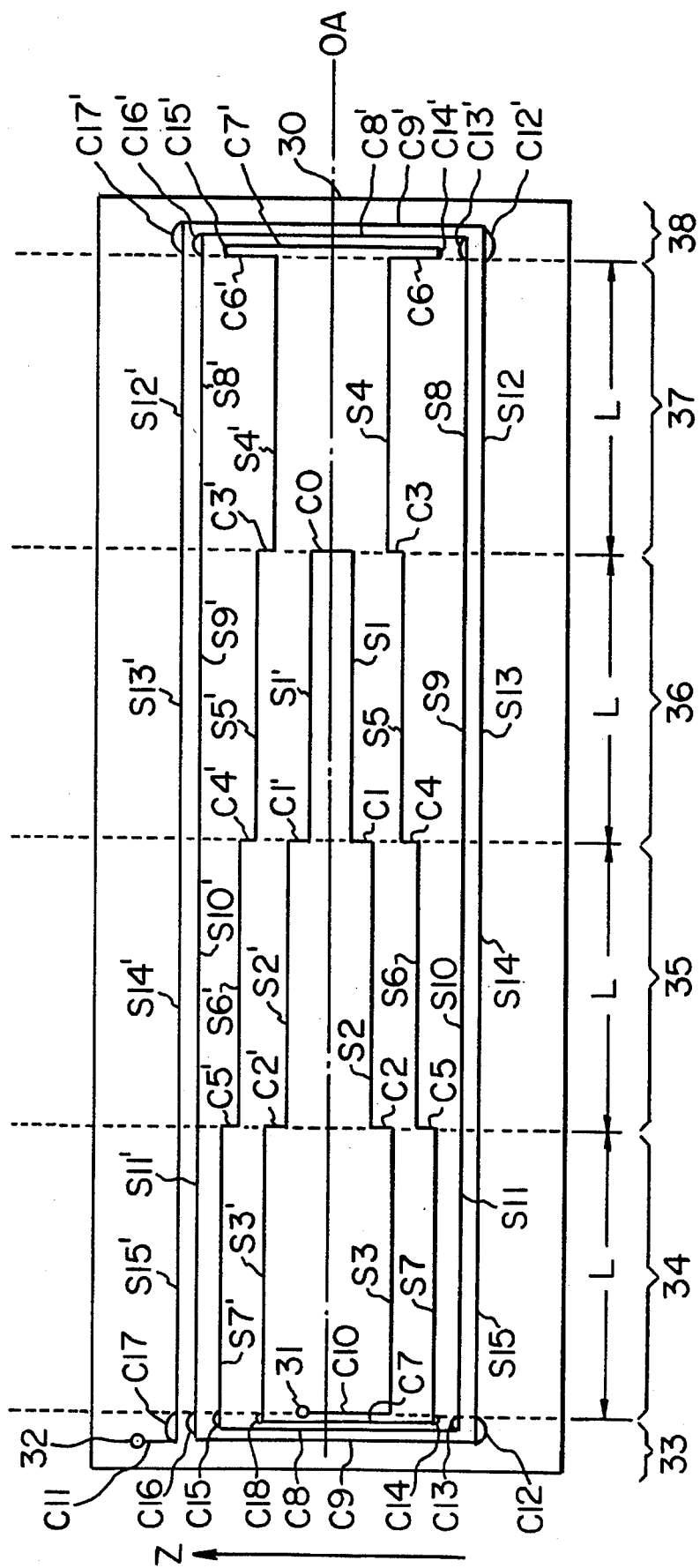
FIG. 1 is a schematic view of a flexible insulative substrate forming a Z-axis magnetic field gradient coil structure according to the present invention.

Referring to FIG. 1, there is shown a Z-axis magnetic field gradient coil structure according to the present invention. This coil structure has a flexible insulative substrate 30 which is at least four times as long as the circumference L of a cylindrical bobbin on which coils are wound and held. A coil pattern consisting of conductive strips S1–S15 and S1'–S15' together with conductive interconnectors C0–C18, C1'–C9' and C12'–C17' has been formed on the surface of this substrate by etching techniques. This coil pattern is connected with a power circuit (not shown) via terminals 31 and 32.

As shown in FIG. 1, the conductive strip pairs S1—S1', S2—S2', ..., S15—S15' are symmetrical with respect to the central line OA of the pattern. The conductive interconnectors successively interconnect the conductive strips such that electrical currents of opposite senses flow through the two conductive strips of each pair.

Figure 2:
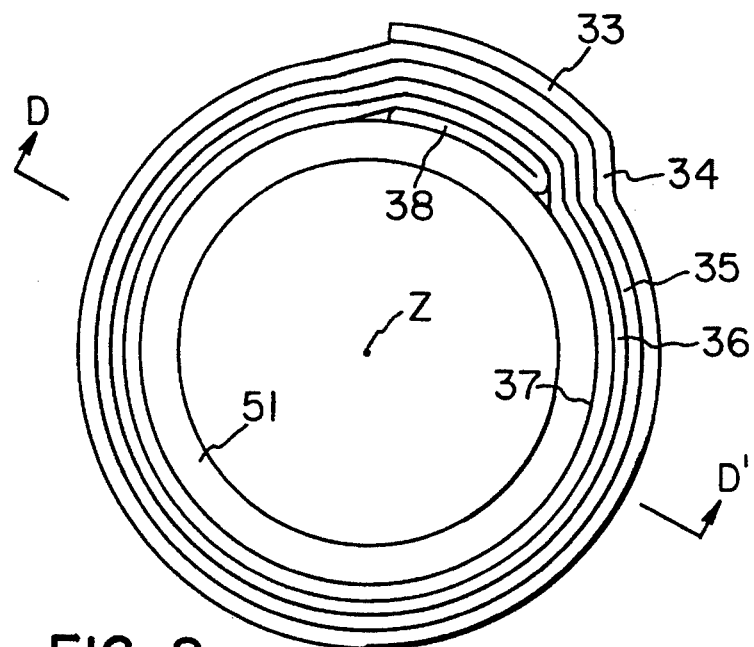
FIG. 2 is a cross-sectional view of the flexible insulative substrate shown in FIG. 1, and in which the substrate has been wound.

FIG. 2 is a cross-sectional view of a coil structure fabricated by winding this substrate 30 on the bobbin, indicated by 51. The substrate 30 has a marginal region 38 in which the conductive interconnectors exist. First, this marginal region 38 is bent toward a region 37 where the conductive strips exist. Then, the region 37 is wound as a bottom layer on the bobbin. The substrate is further bent so as to form regions 36, 35 and 34. Thus, four layers are formed.

Figure 3:
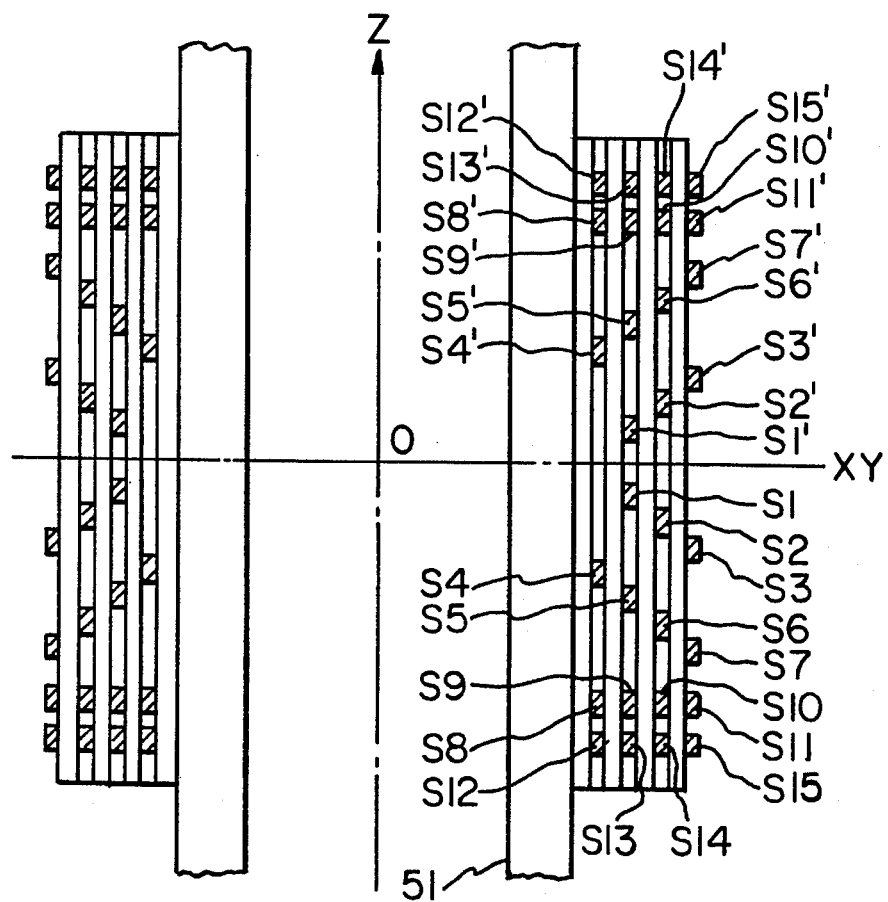
FIG. 3 is a cross-sectional view taken on line D—D' of FIG. 2.

FIG. 3 is a cross-sectional view taken on line D—D' of FIG. 2. The substrate 3b is wound in four layers on the bobbin 51. Fifteen conductive strip pairs S1—S1', S2—S2', ..., S15—S15' are arranged symmetrically about the X-Y plane which passes through the origin 0, i.e., the center of the coil structure, of the central axis Z of the cylindrical bobbin, and is perpendicular to the central axis Z. Each conductive strip forms one turn of coil wound about the Z-axis. If a feeder line from the power supply is connected between the terminals 31 and 32, an electrical current flows through each conductive strip. The electrical current flowing through the conductive strips S1–S15 are opposite in sense to the electrical current flowing through the conductive strips S1'–S15'. As a result, a magnetic field gradient is developed in the bobbin in the direction of the Z-axis.

As shown in FIG. 3, the conductive strip pairs S1—S1', S2—S2', ..., S7—S7' are so arranged that the distance from the X-Y plane increases successively. These conductive strips together form one set of coils, or a distributed winding with a small pitch. On the other hand, the conductive strip pairs S8—S8', S9—S9', ..., S11—S11' are spaced equally from the X-Y plane. Similarly, the conductive strip pairs S12—S12', S13—S13', ..., S15—S15' are spaced equally from the X-Y plane. Each of these two sets of conductive strips forms a multilayer close winding.

Figure 4A:
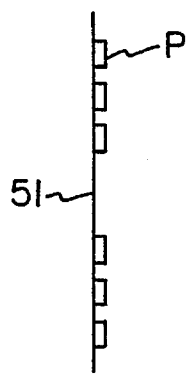
FIG. 4a is a diagram illustrating the arrangement of conductive strips of the Z-axis magnetic field gradient coils proposed in U.S. Pat. No. 4,910,462.
Figure 4B:
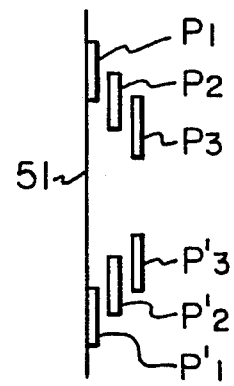
FIG. 4b is a diagram illustrating the arrangement of conductive strips of a coil structure according to the invention.

FIG. 4a shows the arrangement of conductive strips of the Z-axis magnetic field gradient coil proposed in the above-cited U.S. Pat. No. 4,910,462. FIG. 4b schematically shows the arrangement of the conductive strips of a coil according to the present invention. In the known coil of FIG. 4a, the substrate is wound on the bobbin only once. Therefore, if it is necessary to wind the coil many times, then the width of each individual conductive strip P is inevitably decreased. In consequence, the electrical resistance of the conductive strip is increased. In the present invention, the substrate is wound plural times and, therefore, the width of each individual strip can be made larger than heretofore, as shown in FIG. 4b. As a result, a Z-axis magnetic field gradient coil having a smaller electrical resistance is provided.

As shown in FIG. 1, the conductive interconnectors are classified into a first group (i.e., C12–C18 and C12–'C17') extending in the same direction as the conductive strips and a second group (i.e., C0–C11 and C1'–C9') extending perpendicular to that direction. The magnetic field set up by electrical currents flowing through the conductive interconnectors belonging to the second group is perpendicular to the direction of the Z-axis. Therefore, it is not necessary to cancel out this magnetic field. However, the magnetic field set up by electrical currents flowing through the conductive interconnectors belonging to the first group has a component lying in the direction of the Z-axis. Therefore, it is necessary to cancel this magnetic field.

Figure 5:
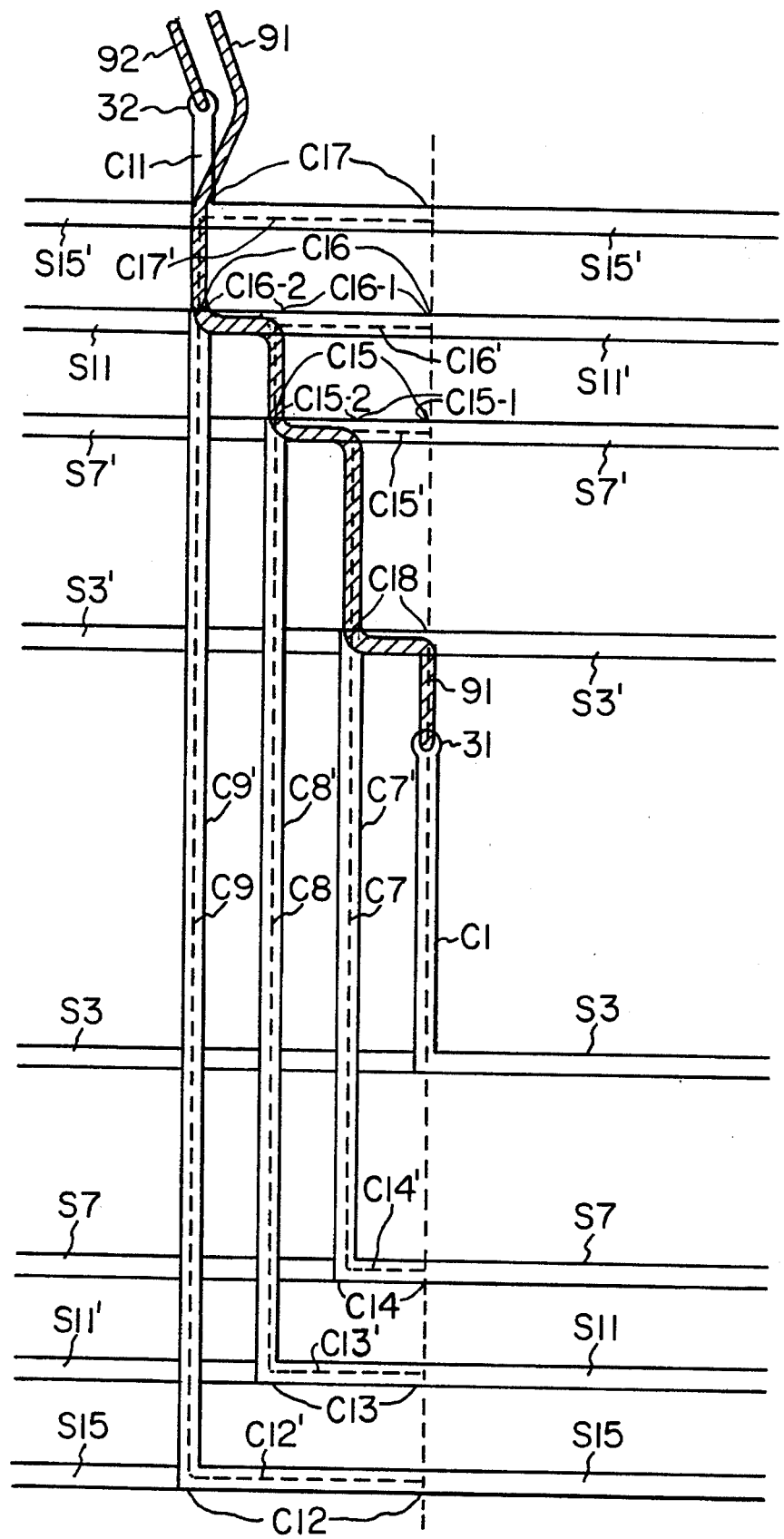
FIG. 5 is an enlarged view of the finally wound portion of the coil structure shown in FIG. 4b.

FIG. 5 is an enlarged view of the finally wound portion of the coil structure. The substrate 30 has a marginal region 33 in which the conductive interconnectors C12–C18 of the first group exist.. The marginal region 38 contains the conductive interconnectors C12'–C17' of the first group. These interconnectors C12–C18 and C12–'C17' overlap each other essentially in the same positions of the coil except for the conductive interconnector C18, because the marginal region 38 is bent toward the region 37 containing conductive strips. Since the electrical currents flowing through the overlapping conductive interconnectors are the same and opposite in sense, the magnetic fields due to the currents having components lying in the direction of the Z-axis cancel out each other. The lengths of the conductive interconnectors C12–C17 and C12'–C17' are so selected that both magnetic fields substantially cancel out each other. For example, the overlapping conductive interconnectors C12 and C12' are equal in length. The conductive interconnectors C13 and C13' are equal in length. The conductive interconnectors C14 and C14' are equal in length. The conductive interconnectors C17 and C17' are equal in length.

However, the marginal region 38 does not have any conductive interconnector overlapping the conductive interconnector C18. A part C15-1 of the conductive interconnector C15 overlaps the conductive interconnector C15' but the remaining portion C15-2 does not overlap the conductive interconnector C15'. Similarly, a part C16-1 of the conductive interconnector C16 overlaps the conductive interconnector C16' but the remaining portion C16-2 does not overlap the interconnector C16'. Therefore, where strict considerations are given to the matter, the magnetic field having a component lying in the direction of the Z-axis and produced by electrical currents flowing through the conductive interconnectors C18, C15-2, and C16-2 is not canceled by the magnetic field produced by the conductive interconnectors existing in the marginal region 38.

In case it is necessary to eliminate this uncanceled magnetic field, the following measures are effective. When feeder lines 91 and 92 are connected with the terminals 31 and 32, it is possible to lay the feeder line 91 in such a way as to overlap the conductive interconnectors C18, C15-2 and C16-2, as shown in FIG. 5. In this structure, the electrical current flowing through the feeder line 91 is opposite in sense to the electrical current flowing through the conductive interconnectors C18, C15-2, and C16-2. Consequently, the magnetic field having a component lying in the direction of the Z-axis and generated by the electrical current flowing through the interconnectors C18, C15-2, and C16-2 can be canceled by the magnetic field produced by the portions of the feeder lines 91 superimposed on those interconnectors.

In the above embodiment, the marginal region 38 is bent back. Where the region 33 is bent back instead of the region 38, the magnetic field having a component lying in the direction of the Z-axis and produced by the electrical currents flowing through the conductive interconnectors present, in the region 38 can be similarly canceled by the magnetic field having a component in the direction of the Z-axis and produced by the electrical current flowing through the conductive interconnectors existing in the region 33.

Figure 6:
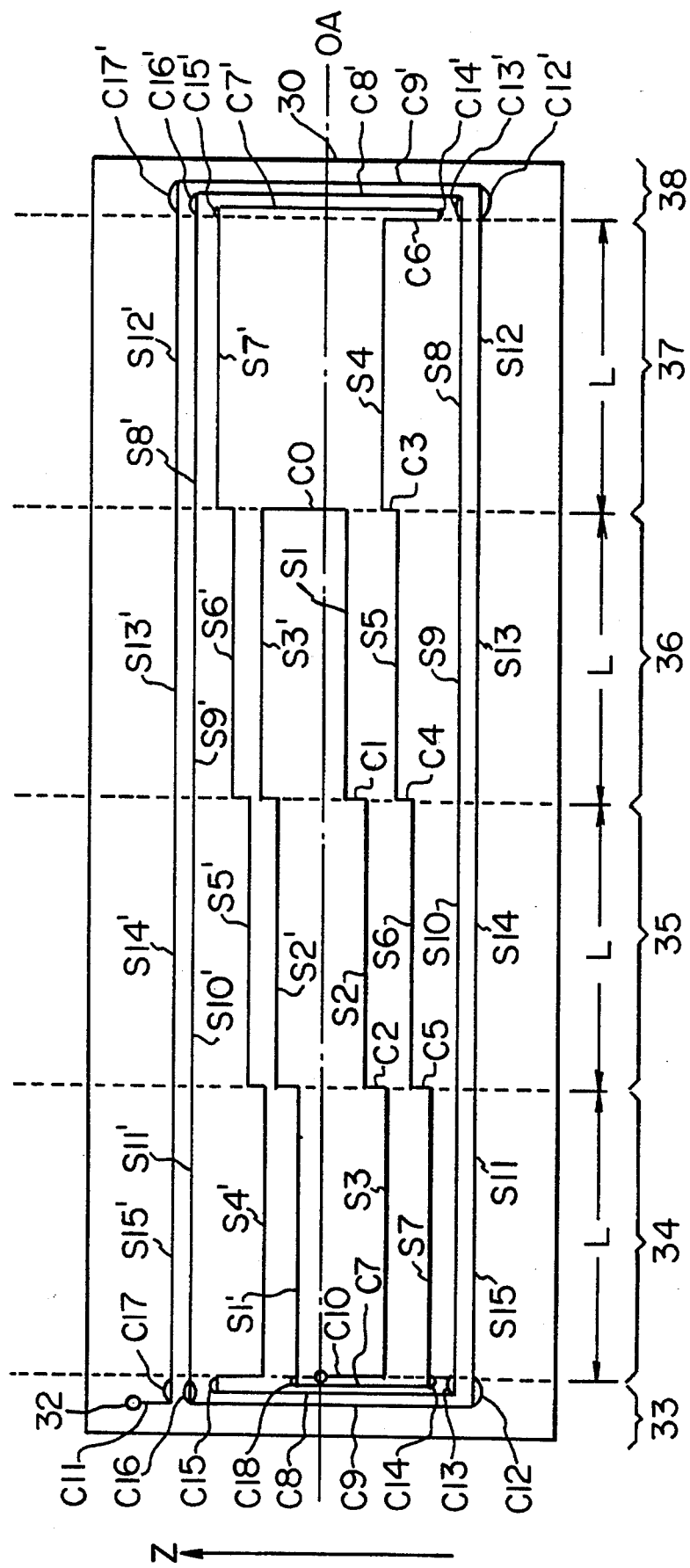
FIG. 6 is a diagram showing a coil pattern which is similar to the coil pattern shown in FIG. 1 but has no symmetry.

In the above-embodiment, a coil pattern which is symmetrical with respect to the central line OA of the pattern, is used and, therefore, conductive strip pairs exist in each layer of the coil structure. However, the symmetry of the coil pattern is not essential to the present invention. FIG. 6 shows a coil pattern which is similar to the coil pattern shown in FIG. 1 but has no symmetry. In the coil structure fabricated by winding the coil pattern shown in FIG. 6, the conductive strip pairs exist in different layers. Of course, the produced Z-axis magnetic field gradient is exactly the same as the gradient produced, using the coil pattern of FIG. 1.

Figure 7:
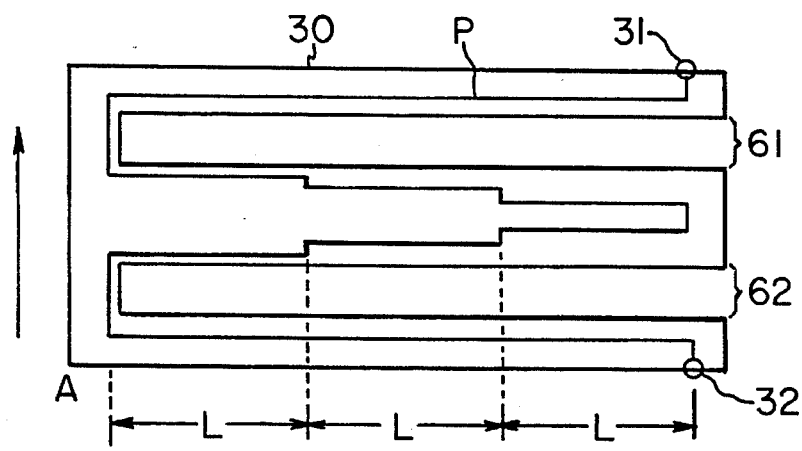
FIG. 7 is a fragmentary view of another flexible insulative substrate forming a Z-axis magnetic field gradient coil structure according to the invention.

FIG. 7 shows a further coil structure according to the invention. In the present embodiment, coils formed on a flexible insulative substrate do not produce a magnetic field gradient of the required strength. Accordingly, wires are additionally wound the substrate. The substrate is provided with cutouts in positions where wires are wound, the cutouts extending in the direction in which the conductive strips extend. Referring to FIG. 7, the substrate 30 is provided with cutouts 61 and 62 at positions where the wires are wound. Therefore, the substrate 30 generally takes an E-shaped form. A desired coil pattern P is formed on the substrate by etching techniques. The coil pattern P has terminals 31 and 32 at opposite ends to permit an electrical current to flow in and out of an external circuit.

This substrate is wound around a bobbin from its end portion A. In the present embodiment, the substrate 30 is wound in three layers on the bobbin. In the coil pattern P shown in FIG. 7, none of the conductive interconnectors extend in the same direction as the conductive strips. This makes it unnecessary to bend back one end portion of the substrate so as to cancel unwanted magnetic field components.

Figure 8:
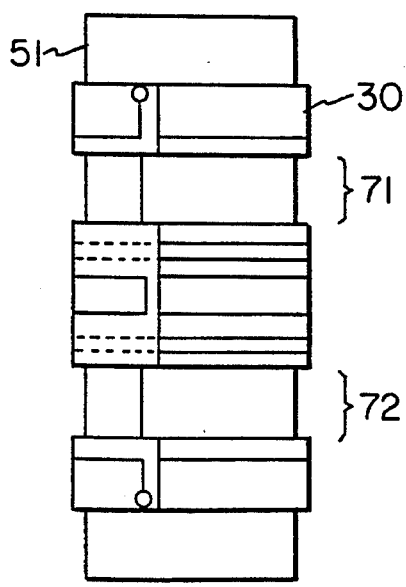
FIG. 8 is a front elevation of a coil structure fabricated by winding the substrate shown in FIG. 7 around a bobbin.
Figure 9:
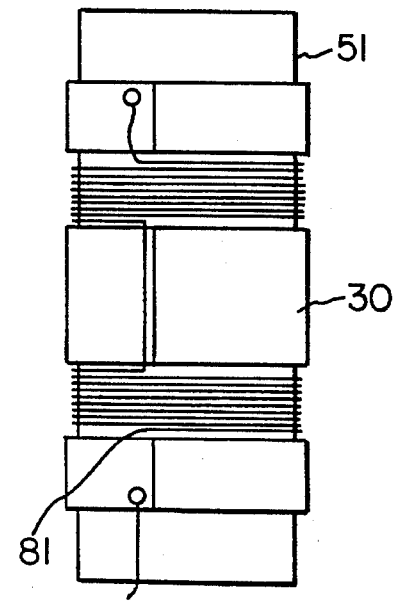
FIG. 9 is a front elevation similar to the front elevation shown in FIG. 8, but in which wires are added and wound on the coil structure.

FIG. 8 shows the substrate 30 shown in FIG. 7, showing the manner in which the substrate 30 is wound on the bobbin 51. The cutouts 61 and 62 form grooves 71 and 72, respectively. Wires 81 are wound in the grooves 71 and 72, respectively, as shown in FIG. 9. Since the grooves 71 and 72 act to guide the wires 81 when they are being wound, they can be wound in desired positions with a desired width.

While preferred embodiments of the present invention have been described, it is to be understood that the invention is not limited to those embodiments and that various changes and modifications may be made. For instance, the coil pattern of the above embodiments constitutes merely one example. Any coil pattern for producing a desired magnetic field gradient can be adopted at will. The number of the layers formed by the wound substrate can be increased further. However, the thickness of the substrate cannot be neglected. Therefore, if the number of layers is large, it is inevitable that the outside diameter of the coil is increased. Therefore, a conductive strip existing in a more outer layer needs a greater length per revolution.

Having thus described my invention with the detail and particularity required by the Patent Laws, what is desired and claimed to be protected by Letters Patent is set forth in the following claims.

What is claimed is:

1. A Z-axis magnetic field gradient coil structure for producing a Z-axis gradient magnetic field responsive to flow of an electrical current I, said coil structure comprising:

a single flexible insulative substrate sheet wound a plurality of times substantially into the form of a cylinder such that said substrate sheet forms multiple layers on said cylinder each wrapping completely around said cylinder;

a coil pattern formed on said multiple layers of said wound substrate sheet and comprising a plurality of pairs of elongated conductive strips and interconnecting means formed on said sheet for causing said current I to flow into a first one of said strips so that the current then flows through each strip successively and flows out of a final one of said strips; and wherein, the conductive strips of each said pair, when said strips are wound with said substrate sheet into a substantially cylindrical form, have a length permitting them to make one revolution around said cylinder, the conductive strips of each said pair being interconnected through said interconnecting means to pairs located on adjacent layers of said substrate sheet, the conductive strips of each said pair being substantially parallel to a central cross-sectional plane perpendicular to a central axis of said cylinder, the conductive strips of each said pair being arranged symmetrically with respect to said central cross-sectional plane such that the electrical current I flows through them in opposite senses, and acts to produce a magnetic field along said Z-axis, said magnetic field produced by the conductive strips of each said pair combining with fields produced by pairs located on all layers of said substrate sheet to form said Z-axis gradient magnetic field.

2. The Z-axis magnetic field gradient coil structure of claim 1, wherein said pairs of conductive strips are spaced unequally from said central cross-sectional plane.

3. The Z-axis magnetic field gradient coil structure of claim 1, wherein said pairs of conductive strips are spaced equally from said central cross-sectional plane.

4. The Z-axis magnetic field gradient coil structure of claim 1, wherein said pairs of conductive strips include a first group of conductive strips spaced equally from said central cross-sectional plane and a second group of conductive strips spaced unequally from said central cross-sectional plane.

5. The Z-axis magnetic field gradient coil structure of claim 1, wherein said coil pattern formed on said single flexible insulative substrate sheet has symmetry with respect to a central line of said coil pattern.

6. The Z-axis magnetic field gradient coil structure of claim 1, wherein said coil pattern formed on said single flexible insulative substrate sheet has no symmetry with respect to a central line of said coil pattern.

7. The Z-axis magnetic field gradient coil structure of claim 1, wherein those of said interconnecting means contained in said coil pattern which are located in initial and final end portions of said substrate sheet when wound into a substantially cylindrical form comprises a first group of interconnecting means extending in the same direction as said conductive strips and a second group of interconnecting means extending perpendicular to said conductive strips, and wherein said initial and final end portions of said substrate sheet are bent back from interfaces between said interconnecting means and said conductive strips so that the interconnecting means of said first group located in said initial and final end portions overlap each other, whereby magnetic fields produced by electrical currents flowing through the interconnecting means contained in the two groups cancel each other.

8. The Z-axis magnetic field gradient coil structure of claim 1, wherein said substrate sheet is provided with cutouts extending in the same directions as said conductive strips, and wherein wires are wound in grooves formed in said coil structure formed by winding said substrate sheet having the cutouts.

* * * * *

UNITED STATES PATENT AND TRADEMARK OFFICE
CERTIFICATE OF CORRECTION

PATENT NO. : 5,623,208
DATED : April 22, 1997
INVENTOR(S) : Kenichi Hasegawa

It is certified that error appears in the above-indentified patent and that said Letters Patent is hereby corrected as shown below:

Column 3 Line 40 "substrate 3b" should read --substrate 30--.

Column 4 Line 13 "C12-'C17')" should read --C12'-C17')--.

Column 4 Line 28 "exist.." should read --exist.--.

Column 4 Line 30 "C12-'C17'" should read --C12'-C17'--.

Column 5 Line 18 "present, in" should read --present in--.

Signed and Sealed this

Twenty-second Day of July, 1997

Attest:

BRUCE LEHMAN

*Attesting Officer*   Commissioner of Patents and Trademarks